US006989318B2

(12) United States Patent
Doris et al.

(10) Patent No.: US 6,989,318 B2
(45) Date of Patent: Jan. 24, 2006

(54) METHOD FOR REDUCING SHALLOW TRENCH ISOLATION CONSUMPTION IN SEMICONDUCTOR DEVICES

(75) Inventors: Bruce B. Doris, Brewster, NY (US); Ying Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/605,727

(22) Filed: Oct. 22, 2003

(65) Prior Publication Data

US 2005/0090072 A1 Apr. 28, 2005

(51) Int. Cl.
*H01L 21/76* (2006.01)
*H01L 29/00* (2006.01)

(52) U.S. Cl. ...................... 438/433; 438/242; 257/501; 257/506

(58) Field of Classification Search ................ 438/242, 438/433, 434, 783; 257/501, 506, 510
See application file for complete search history.

(56) References Cited

U.S. PATENT DOCUMENTS

| | | | | |
|---|---|---|---|---|
| 4,634,494 | A * | 1/1987 | Taji et al. | 438/705 |
| 5,286,340 | A * | 2/1994 | Yates et al. | 257/E21.148 |
| 5,960,276 | A | 9/1999 | Liaw et al. | |
| 6,146,970 | A | 11/2000 | Witek et al. | |
| 6,194,285 | B1 | 2/2001 | Lin et al. | |
| 6,214,698 | B1 | 4/2001 | Liaw et al. | |
| 6,437,417 | B1 | 8/2002 | Gilton | |
| 6,492,220 | B2 * | 12/2002 | Ikeda | 438/221 |
| 6,498,383 | B2 | 12/2002 | Beyer et al. | |
| 6,514,833 | B1 | 2/2003 | Ishida et al. | |
| 6,576,558 | B1 | 6/2003 | Lin et al. | |
| 2002/0064967 | A1 | 5/2002 | Whitman et al. | |
| 2002/0102793 | A1 | 8/2002 | Wu | |
| 2004/0238914 | A1 * | 12/2004 | Deshpande et al. | 257/506 |

* cited by examiner

*Primary Examiner*—Kevin M. Picardat
(74) *Attorney, Agent, or Firm*—Margaret Pepper; Cantor Colburn LLP

(57) ABSTRACT

A method for reducing shallow trench isolation (STI) consumption during semiconductor device processing includes forming a hardmask over a semiconductor substrate, patterning the hardmask and forming a trench within the substrate. The trench is filled with an insulative material that is implanted with boron ions and thereafter annealed.

16 Claims, 3 Drawing Sheets

METHOD FOR REDUCING SHALLOW TRENCH ISOLATION CONSUMPTION IN SEMICONDUCTOR DEVICES

BACKGROUND OF INVENTION

The present invention relates generally to semiconductor device processing and, more particularly, to a method for reducing shallow trench isolation consumption in semiconductor devices.

In typical semiconductor device manufacturing processes, trench isolation, particularly shallow trench isolation (STI), is used to replace conventional local oxidation of silicon (LOCOS). An STI region is generally composed of a pure oxide material, such as a high-density plasma (HDP) oxide or a plasma tetraethyl orthosilicate (TEOS). Since the STI trench formation and STI fill processes are performed at the beginning of the chip manufacturing process, the STI oxide encounters many subsequent wet etch processing steps (e.g., with dilute hydrofluoric acid (HF) or buffered HF), as well as dry etching steps (e.g., reactive ion etching (RIE)). Thus, as a normal part of the fabrication process leading to the final device, at least a portion of the STI oxide will be etched away. This leads to a change in the height of the STI oxide as compared with the rest of the silicon active area (both of which exhibit various height changes as the silicon wafer proceeds through the chip manufacturing process).

Because there are many etch steps between STI formation and polysilicon deposition, and because each etching step has individual variables associated therewith, there is often a lack of control over the amount of etching the STI actually undergoes. In wet chemical baths, for example, the HF concentration is known to change over the life of the bath. Also, depending on the application technique used to administer the HF, there may also be variations of the etching rate on the wafer itself. Similarly, RIE tools, which typically process one wafer at a time, have well known across-wafer variations and wafer-to-wafer variations.

One way to reduce the erosion of the STI region is simply to eliminate as many wet and dry etch steps as possible between STI formation and deposition. For example, elimination of the sacrificial oxidation and oxide strip steps used to condition the active area surface provides some simplification. However, this approach can only be taken so far, as some of these steps may be necessary to create the final circuit and achieve necessary yield. Another way to reduce STI erosion is to reduce the amount of exposure to chemical etchants used in each of the required etch steps. Likewise, this approach is problematic since the etchant steps are often made intentionally long in order to remove particulates, remedy inconsistent oxide thicknesses or create hydrogen-terminated surfaces for subsequent processes.

Other efforts have been made to form caps over the STI material in order to inhibit STI erosion during subsequent etching steps used to form the active areas. For example, U.S. Pat. No. 6,146,970 to Witek, et al. describes the use of a silicon nitride or nitrogen-rich silicon oxynitride layer for capping an oxide STI material such as TEOS. However, the Witek, et al. bilayer approach adds significant cost and process complexity to the formation of STI. In particular, Witek, et al. use two separate liner processes, two separate deposition processes and two separate CMP processes.

In this regard, acceptable solutions to the erosion of STI are preferably simple and cost-effective. In addition to exhibiting simplicity and low cost, acceptable solutions should have sufficient robustness such that it is unnecessary to constrain other process variables simply to control STI height. At the same time, such solutions must preferably fit within existing processes so as to avoid affecting product yield and cost.

STI consumption is a particularly significant challenge for state of the art, high performance CMOS. One requirement is that STI to active area step height be minimal (e.g., less than about 20 nm), just prior to gate poly deposition. If this requirement is not met then the gate stack lithography may be compromised. The step height requirement is even more stringent for ultra-thin Si channel devices. If the STI is recessed below the active area, then a reentrant structure is formed which can trap gate poly that cannot be removed by the gate stack etch. In the case of process flows using raised source/drain diffusions, the STI to active area step height should still be slightly positive. The slightly positive step with the STI is higher is needed to prevent lateral growth of the raised source/drain regions which can cause shorting for minimum-spaced active area features.

In the case of bulk devices, the STI/active area step height must not be lower than the source drain junction at the time of silicidation. High off current can result from silicide bridging from the source drain to the well. Accordingly, for these and other reasons, a need exists for an effective method for reducing STI consumption.

SUMMARY OF INVENTION

The foregoing discussed drawbacks and deficiencies of the prior art are overcome or alleviated by a method for reducing shallow trench isolation (STI) consumption during semiconductor device processing. In an exemplary embodiment, the method includes forming a hardmask over a semiconductor substrate, patterning the hardmask and forming a trench within the substrate. The trench is filled with an insulative material that is implanted with boron ions and thereafter annealed.

In another aspect, a method for reducing the etch rate of an insulator layer includes implanting the insulative material with boron ions, and annealing the insulative material.

In still another aspect, a semiconductor device trench isolation structure includes a substrate having a trench region filled with an insulative material, wherein the insulative material is implanted with boron ions and thereafter annealed.

BRIEF DESCRIPTION OF DRAWINGS

Referring to the exemplary drawings wherein like elements are numbered alike in the several Figures.

DETAILED DESCRIPTION

The primary source of shallow trench isolation (STI) consumption during semiconductor device manufacturing is hydrofluoric acid (HF) cleaning, which is typically performed prior to gate dielectric, raised source/drain and silicide formation. It has recently been observed that there is a significant reduction in etch rate for boron-implanted and annealed high-density plasma (HDP) oxide as compared to non-implanted HDP oxide and phosphorus-implanted HDP oxide using HF chemistries. Accordingly, the present disclosure introduces a novel integration scheme wherein boron is selectively implanted and annealed into the STI region in a self-aligned manner. The scheme allows for the reduction in STI consumption by about 15% or more as compared to non-implanted STI.

Briefly stated, an exemplary embodiment of a method for reducing shallow trench isolation (STI) consumption utilizes a standard process flow for initially creating an STI. Then, following an insulative material (e.g., $SiO_2$) recess process, the wafer is ion implanted with boron. Since the hardmask used to form the STI (e.g., a pad nitride) covers the active device regions, the boron material has no influence on the device characteristics. On the other hand, the HDP oxide implanted with boron and thereafter annealed has been found to etch at a reduced rate of about 15% or more, compared to intrinsic and phosphorous-implanted HDP oxide. An exemplary process flow is illustrated in FIGS. 1–6.

Figure 1:
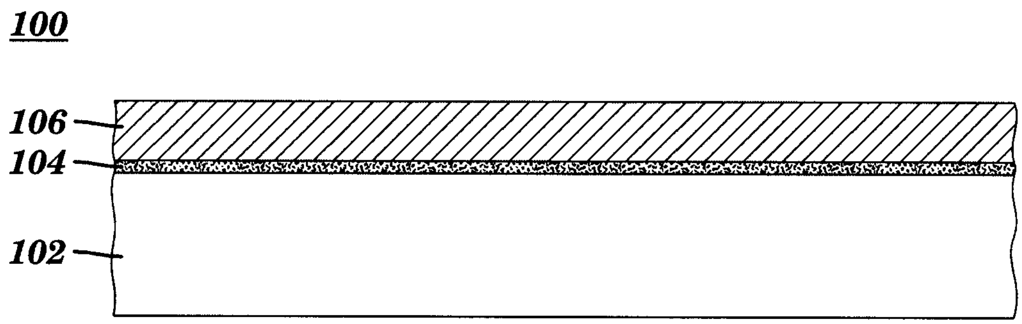
FIGS. 1 through 6 illustrate, in cross-sectional views, a method for forming shallow trench isolations with reduced consumption susceptibility, in accordance with an embodiment of the invention.
Figure 2:
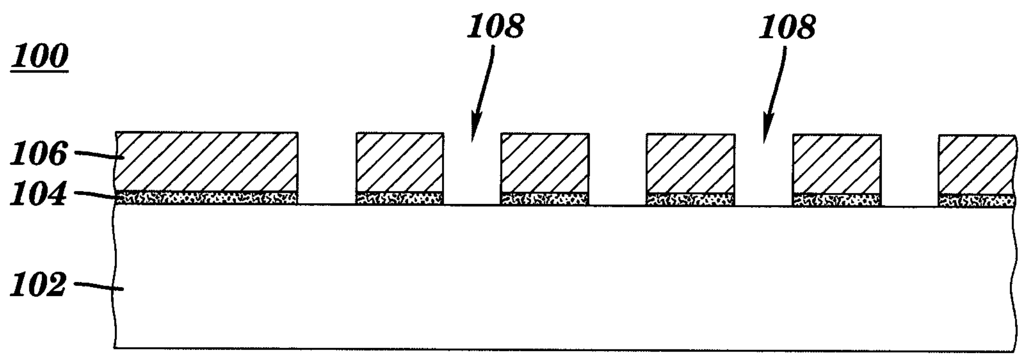

As initially shown in FIG. 1, a semiconductor device 100 includes a substrate 102 (e.g., bulk silicon, silicon-on insulator, etc.) having a pad oxide layer 104 formed thereupon. The pad oxide layer 104 may be, for example, a thermally grown silicon dioxide ($SiO_2$) layer. Then, a pad nitride layer 106 (e.g., SiN) is formed over pad oxide layer 104 to serve as a hardmask for subsequent STI patterning, as illustrated in FIG. 2. In particular, FIG. 2 illustrates a plurality of individual openings 108 that may be patterned in the hardmask using conventional lithography and etching steps. Thus, during the trench etch process, the pad nitride layer 106 may be used as a hardmask to etch the silicon trenches. Alternatively, the hardmask patterning photoresist (not shown) may be kept in place and used to etch the trenches.

Figure 3:
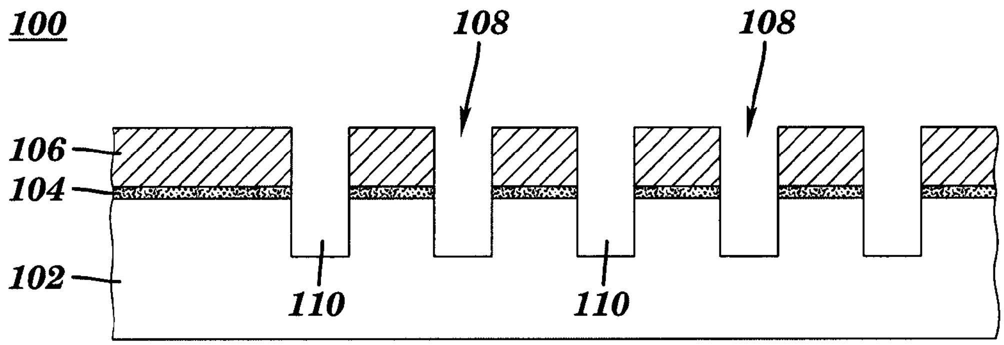
Figure 4:
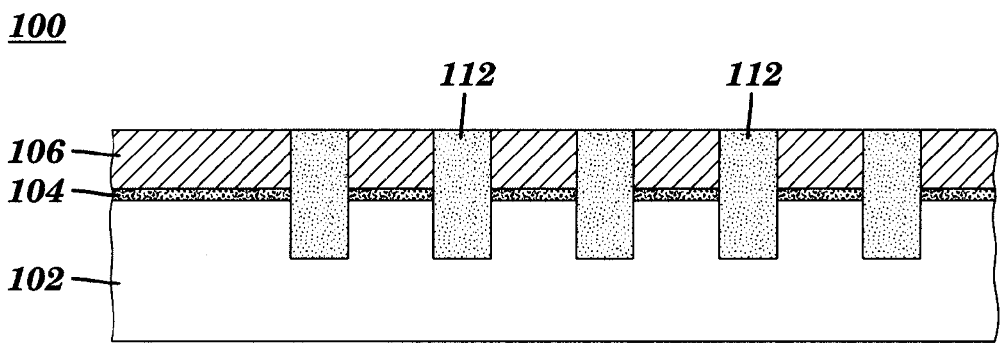

In either case, FIG. 3 illustrates the formation of individual trenches 110 in the substrate 102, using the patterned openings 108. Then, an insulative STI material 112 is formed within the trenches 110, including the openings 108 formed in the pad nitride/pad oxide hardmask, and is subsequently planarized by chemical mechanical polishing (CMP), as illustrated in FIG. 4. In an exemplary embodiment, the insulative material is a high-density plasma (HDP) oxide deposited within the trenches 110 and openings 108. The HDP $SiO_2$ deposition may be implemented in accordance with any suitable process known in the art. In addition, a liner material may optionally be formed within the trenches 110 prior to HDP deposition. For example, the liner material may include a $SiO_2$ liner, or a nitride (SiN) liner to serve as a diffusion barrier. Once the HDP oxide material 112 is deposited, an HDP annealing step may also be performed.

Figure 5:
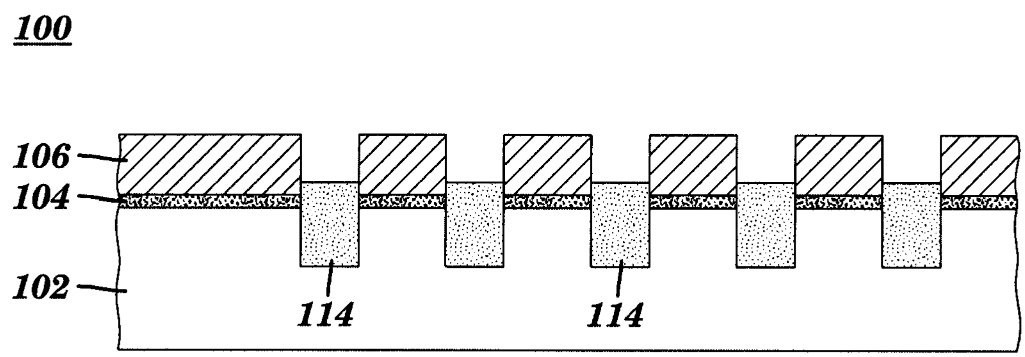
Figure 6:
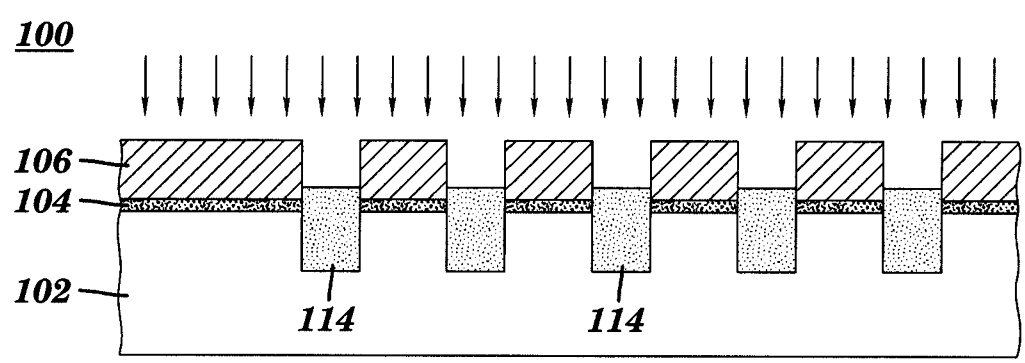

Referring now to FIG. 5, an trench recess step is used to recess a portion of the HDP oxide material 112 so as to create the individual STIs 114 at a desired step height with regard to the pad oxide layer 104. Finally, as shown in FIG. 6, a boron ion implant (I/I) is performed (as indicated by the arrows) with the pad nitride 106 hardmask still in place, thereby self-aligning the boron implant to the STIs 114. The implant energy and pad SiN 106 thickness may be used as parameters in order to define the implant profile, while preventing the active regions of the device 100 from being implanted with the boron. Following the ion implantation, an annealing step is performed.

The table shown below illustrates a comparison between etch rates of undoped STI material, versus phosphorus-implanted (N+) HDP oxide and boron-implanted (P+) HDP oxide, with and without an annealing step. The data shown therein was determined using 40:1 buffered HF (BHF) etch chemistry.

| Film | Dopant | No Anneal Etch rate | 1050° C. Spike Anneal |
|---|---|---|---|
| HDP Oxide | none | 193 Å/min | 193 Å/min |
| HDP Oxide | phosphorus | 360 Å/min | 294 Å/min |
| HDP Oxide | boron | 245 Å/min | 161 Å/min |

For the phosphorus (N+) ion implantation, a germanium dose of about $3\times10^{14}$ atoms/cm$^2$ at an implant energy of about 30 keV, and a phosphorus dose of about $1\times10^{15}$ atoms/cm$^2$ at an implant energy of about 12 keV was used. For the boron (P+) implant, a germanium dose of about $3\times10^{14}$ atoms/cm$^2$ at an implant energy of about 30 keV, and a boron dose of about $6\times10^{15}$ atoms/cm$^2$ at an implant energy of about 9 keV was used. In both instances, the ion implantations were carried out at a zero degree angle.

As can be seen from the table above, without an annealing step, the undoped STI material has a smaller etch rate with respect to both phosphorus (N+) and boron (P+) doping. With an annealing step, there is substantially no change with respect to undoped STI material. It is further noted that, with the doped and annealed samples, there is a decreased etch rate of both phosphorus (N+) and boron (P+) doped HDP oxide as respectively compared to the un-annealed, doped wafers. However, the annealed phosphorus (N+) type STI material still has a greater etch rate than the undoped oxide. On the other hand, the combination of the boron doping with the annealing step results in a reduced etch rate of about 161 Å/minute.

As will be appreciated, the particular implant dosage and energy of the boron ion implantation step will depend on certain parameters such as oxide thickness, for example. Accordingly, an exemplary range of boron implantation dosage may be from about $1\times10^{15}$ atoms/cm$^2$ to about $2\times10^{16}$ atoms/cm$^2$, or more preferably, from about $3\times10^{15}$ atoms/cm$^2$ to about $1\times10^{16}$ atoms/cm$^2$. It is further contemplated that the above described method may have additional applicability to other insulative layers in addition to shallow trench isolation structures. More generally, the method may be used whenever it is desired to reduce the etch rate of an oxide layer.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for reducing shallow trench isolation (STI) consumption during semiconductor device processing, the method comprising:

forming a hardmask over a semiconductor substrate;

patterning said hardmask and forming a trench within said substrate;

filling said trench with an insulative material;

implanting said insulative material with boron ions with remaining portions of said hardmask still in place so as to prevent said boron ions from being implanted within active areas of said semiconductor substrate; and annealing said insulative material.

2. The method of claim 1, wherein said hardmask further comprises:

a pad oxide material formed on said substrate; and a pad nitride material formed on said pad oxide.

3. The method of claim 1, wherein said comprising recessing a portion of said insulative material prior to said implanting said insulative material.

4. The method of claim 1, wherein said implanting said insulative material is carried out at a boron ion dose of about $1\times10^{15}$ atoms/cm$^2$ to about $2\times10^{16}$ atoms/cm$^2$.

5. The method of claim 1, wherein said implanting said insulative material is carried out at a boron ion dose of about $3\times10^{15}$ atoms/cm$^2$ to about $1\times10^{16}$ atoms/cm$^2$.

6. The method of claim 1, wherein said implanting said insulative material is carried out at a boron ion dose of about $6\times10^{15}$ atoms/cm$^2$.

7. The method of claim 1, further comprising fanning a nitride liner within said trench prior to said filling said trench with an insulative material.

8. The method of claim 1, further comprising forming a thermal oxide liner within said trench prior to said filling said trench with an insulative material.

9. The method of claim 1, wherein said insulative material further comprising a high-density plasma oxide (HDP) material.

10. A semiconductor device trench isolation structure, comprising:

a substrate having a trench region filled with an insulative material, wherein said insulative material is implanted with boron ions and thereafter annealed, said boron ions implanted with a patterned hardmask protecting active areas of a semiconductor substrate so as to prevent said boron ions from being implanted within said active areas of said semiconductor substrate, thereby self-aligning said boron ions to said trench region.

11. The trench isolation structure of claim 10, wherein said boron ions are implanted at a dose of about $1\times10^{15}$ atoms/cm$^2$ to about $2\times10^{16}$ atoms/cm$^2$.

12. The trench isolation structure of claim 10, wherein said boron ions are implanted at a dose of about $3\times10^{15}$ atoms/cm$^2$ to about $1\times10^{16}$ atoms/cm$^2$.

13. The trench isolation structure of claim 10, wherein said boron ions are implanted at a dose of about $6\times10^{15}$ atoms/cm$^2$.

14. The trench isolation structure of claim 10, wherein said insulative material is formed over a nitride liner formed within said trench.

15. The trench isolation structure of claim 10, wherein said insulative material is formed over a thermal oxide liner formed within said trench.

16. The trench isolation structure of claim 10, wherein said insulative material filter comprises a high-density plasma oxide (HDP) material.

* * * * *